US011177380B2

(12) United States Patent
Wehrhahn-Kilian et al.

(10) Patent No.: US 11,177,380 B2
(45) Date of Patent: Nov. 16, 2021

(54) SILICON CARBIDE SEMICONDUCTOR COMPONENT

(71) Applicant: Infineon Technologies AG, Neubiberg (DE)

(72) Inventors: Larissa Wehrhahn-Kilian, Erlangen (DE); Reinhold Schoerner, Grossenseebach (DE)

(73) Assignee: Infineon Technologies AG, Neubiberg (DE)

( * ) Notice: Subject to any disclaimer, the term of this patent is extended or adjusted under 35 U.S.C. 154(b) by 119 days.

(21) Appl. No.: 16/361,888

(22) Filed: Mar. 22, 2019

(65) Prior Publication Data

US 2019/0296143 A1    Sep. 26, 2019

(30) Foreign Application Priority Data

Mar. 23, 2018   (DE) .......................... 102018106992.8

(51) Int. Cl.
*H01L 29/78*   (2006.01)
*H01L 29/06*   (2006.01)
*H01L 29/10*   (2006.01)
*H01L 29/16*   (2006.01)
*H01L 27/06*   (2006.01)
(Continued)

(52) U.S. Cl.
CPC .......... *H01L 29/7804* (2013.01); *H01L 27/06* (2013.01); *H01L 29/0615* (2013.01); *H01L 29/1095* (2013.01); *H01L 29/1608* (2013.01); *H01L 29/739* (2013.01); *H01L 29/78* (2013.01);
(Continued)

(58) Field of Classification Search
CPC ............ H01L 29/7804; H01L 29/0615; H01L 29/1095; H01L 29/1608
See application file for complete search history.

(56) References Cited

U.S. PATENT DOCUMENTS

| 2015/0162406 A1* | 6/2015 | Laven ................. H01L 29/0696 257/335 |
| 2016/0204097 A1* | 7/2016 | Laven ................. H01L 29/7397 361/56 |
| 2017/0221989 A1* | 8/2017 | Hirler ................. H01L 29/7813 |

FOREIGN PATENT DOCUMENTS

DE    102015114429 A1    3/2017

OTHER PUBLICATIONS

Hino, S., et al., "Demonstration of SiC-MOSFET Embedding Schottky Barrier Diode for Inactivation of Parasitic Body Diode", Materials Science Forum, vol. 897, 2017, pp. 477-482.
(Continued)

*Primary Examiner* — Fernando L Toledo
*Assistant Examiner* — Valerie N Newton
(74) *Attorney, Agent, or Firm* — Murphy, Bilak & Homiller, PLLC

(57) ABSTRACT

A drift structure having a drift zone of a first conductivity type is formed in a SiC semiconductor body of a semiconductor component. Transistor cells each include a doping region and a source region in the SiC semiconductor body. The doping region forms a first pn junction with the drift structure and a second pn junction with the source region. The doping region is electrically connected to a first load electrode. A diode region is formed between the transistor cells and a side surface of the SiC semiconductor body. The diode region is electrically connected to the first load electrode and forms a third pn junction with the drift
(Continued)

structure. An emitter efficiency of the diode region is higher than an emitter efficiency of the doping region.

21 Claims, 13 Drawing Sheets

(51) Int. Cl.
  *H01L 29/739* (2006.01)
  *H01L 29/04* (2006.01)
(52) U.S. Cl.
  CPC ........ *H01L 29/7813* (2013.01); *H01L 29/045* (2013.01)

(56) References Cited

OTHER PUBLICATIONS

Kawahara, Koutarou, et al., "6.5 kV Schottky-Barrier-Diode-Embedded SiC-MOSFET for Compact Full-Unipolar Module", Proceedings of The 29th International Symposium on Power Semiconductor Devices & ICs, Sapporo, Japan, May 28-Jun. 1, 2017, pp. 41-44.

* cited by examiner

FIG 6
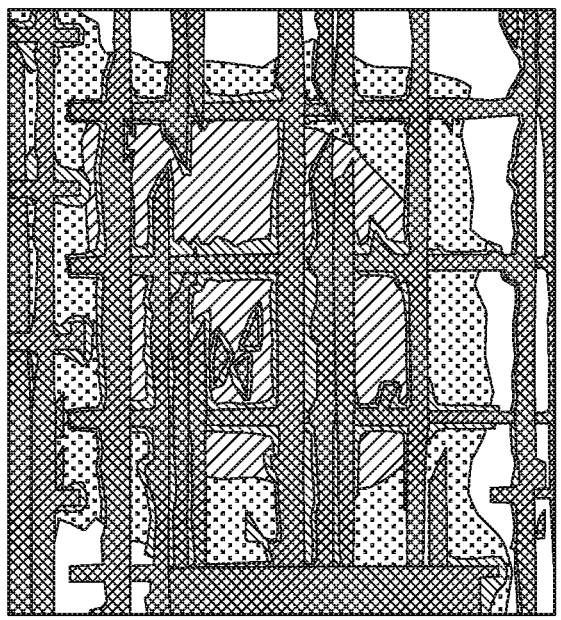
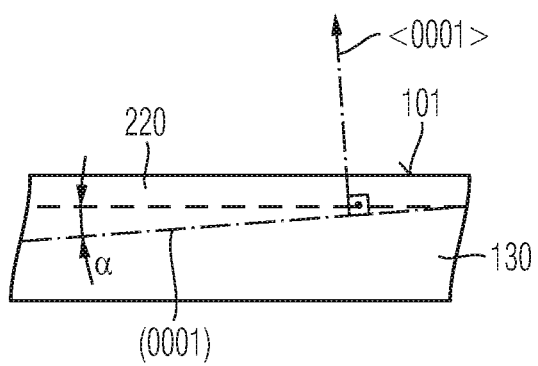

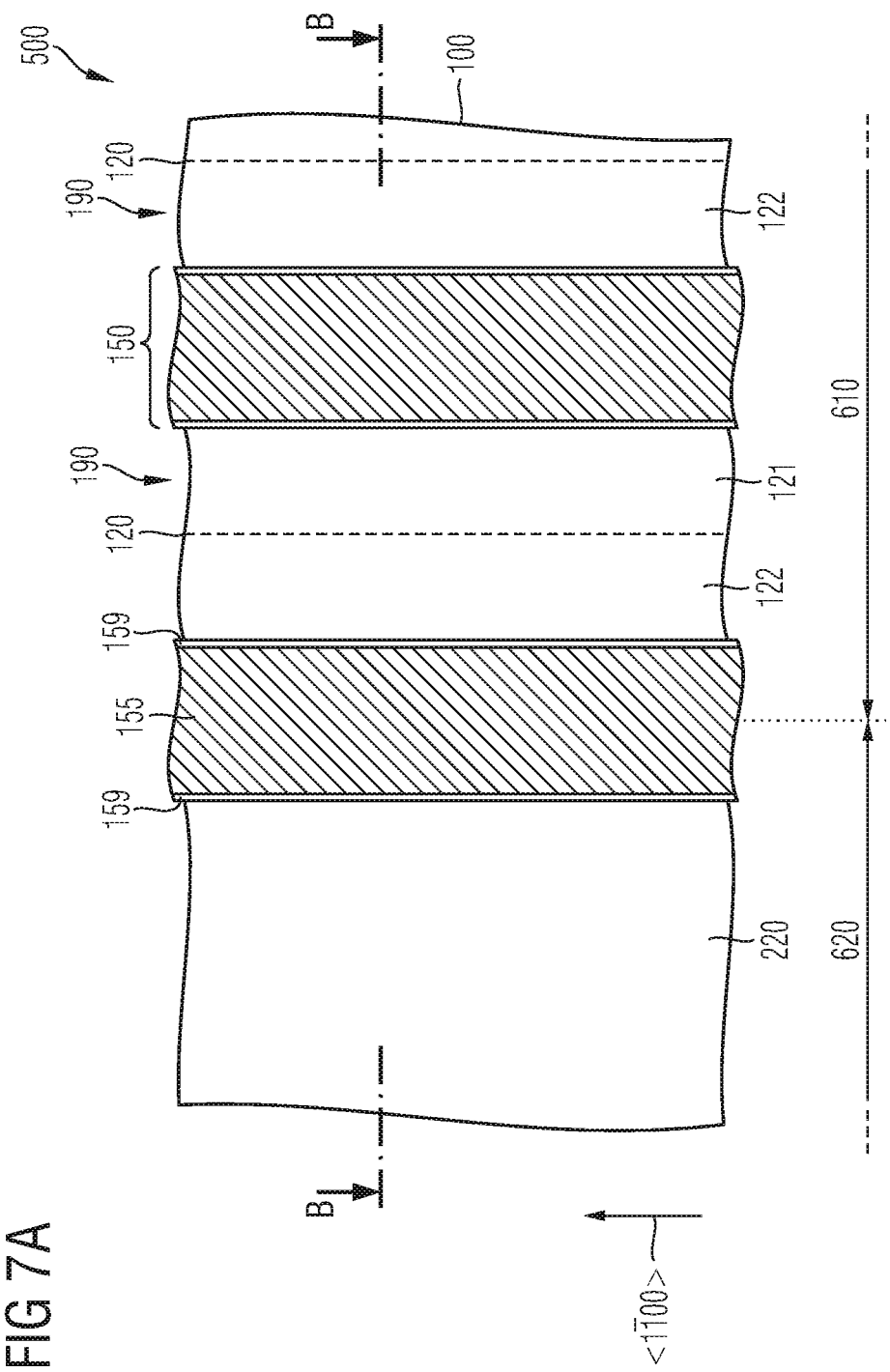

SILICON CARBIDE SEMICONDUCTOR COMPONENT

BACKGROUND

In semiconductor components having field effect transistor structures and a drift zone, besides the source regions typically the body regions are also connected to the source metallization. The pn junction between the body regions and the drift zone forms an intrinsic body diode that is operated in the forward direction in the reverse-biased state of the semiconductor component. Electrical properties of the body diode, for example threshold voltage, forward voltage and current-carrying capacity, result inter alia from the dopings of the body regions and the drift zone, geometric dimensions of the pn junctions and also material properties at the semiconductor/metal junctions, which are usually coordinated with the transistor properties sought.

The present application is directed to a SiC(silicon carbide) semiconductor component having an integrated reverse diode, the operation of which remains as far as possible without a negative influence on the transistor properties.

SUMMARY

One exemplary embodiment of the present disclosure relates to a semiconductor component comprising a SiC semiconductor body, in which a drift structure having a drift zone of a first conductivity type is formed. Transistor cells each comprise a doping region and a source region in the SiC semiconductor body. The doping region forms a first pn junction with the drift structure and a second pn junction with the source region and is electrically connected to a first load electrode. A diode region is formed between the transistor cells and a side surface of the SiC semiconductor body. The diode region is electrically connected to the first load electrode and forms a third pn junction with the drift structure. An emitter efficiency of the diode region is higher than that in the doping region.

A further exemplary embodiment of the present disclosure relates to a semiconductor component comprising a SiC semiconductor body. A drift structure having a drift zone of a first conductivity type is formed in the SiC semiconductor body. A transistor cell in a cell array area comprises a doping region and a source region. The doping region forms a first pn junction with the drift structure and a second pn junction with the source region and is electrically connected to a first load electrode. A diode region is formed in a diode area between the cell array area and a side surface of the SiC semiconductor body. The diode region is electrically connected to the first load electrode, forms a third pn junction with the drift structure and has a higher emitter efficiency than the doping region.

Further features and advantages of the semiconductor component described here will become apparent to the person skilled in the art from the exemplary embodiments described in detail below, the figures and the patent claims.

BRIEF DESCRIPTION OF THE DRAWINGS

The accompanying drawings serve to provide an understanding of exemplary embodiments for a silicon carbide semiconductor component, are included in the disclosure and form a part thereof. The drawings merely illustrate exemplary embodiments and together with the description serve to elucidate same. Consequently, the silicon carbide semiconductor component described here is not restricted to the exemplary embodiments by the description thereof. Further exemplary embodiments and numerous advantages from among those intended are evident from the understanding of the following detailed description and from combinations of the following exemplary embodiments, even if they are not explicitly described. The elements and structures shown in the drawings are not necessarily illustrated in a manner true to scale with respect to one another. Identical reference signs refer to identical or mutually corresponding elements and structures.

FIG. 6 shows an electroluminescence image of a SiC semiconductor body with diode regions for elucidating properties of the embodiments.

FIGS. 7A and 7B schematically show a horizontal and a vertical cross section through a section of a semiconductor component in accordance with one embodiment with strip-like transistor cells having deep trench gate electrodes and a transistor channel on one side.

DETAILED DESCRIPTION

Figure 1A:
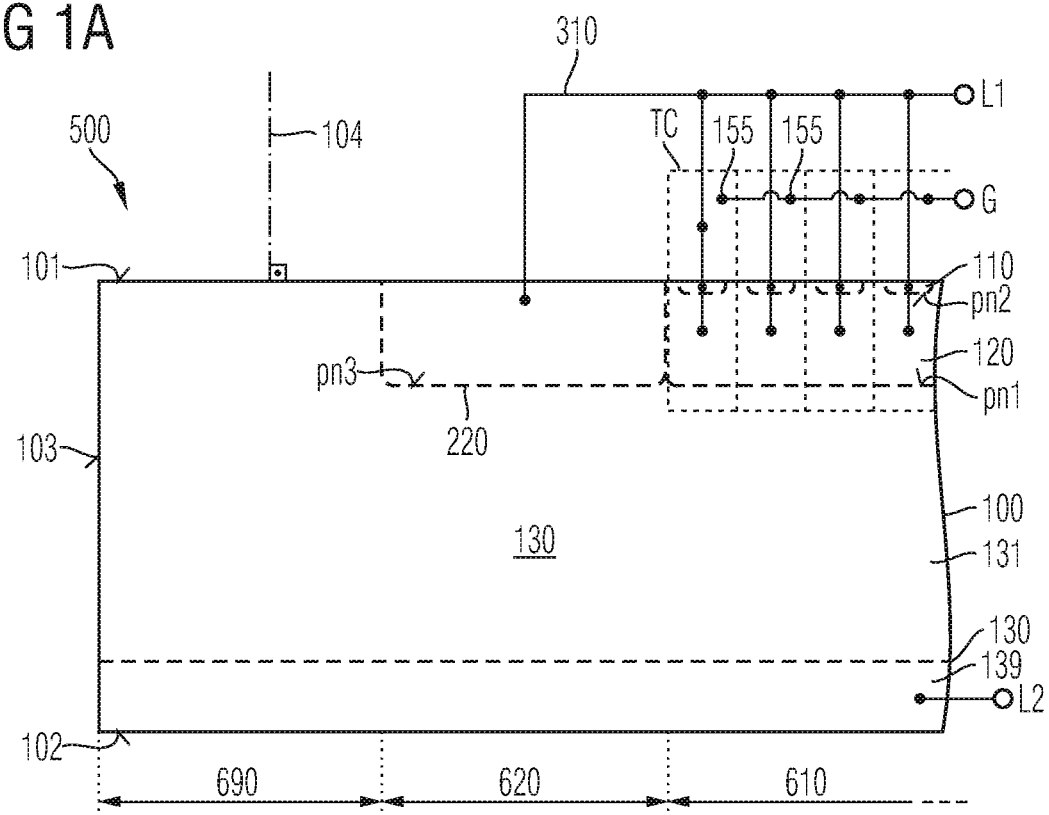
FIGS. 1A and 1B schematically show a plan view and a vertical cross section of a SiC semiconductor body with a diode region having a high emitter efficiency.

In the following detailed description, reference is made to the accompanying drawings, which form part of the disclosure and show specific exemplary embodiments of a silicon carbide semiconductor component for illustration purposes. In this context, a direction terminology such as "top side", "bottom", "front side", "rear side", "at the front", "at the back", etc. is related to the orientation of the figures currently being described. Since the components of the exemplary embodiments can be positioned in different orientations, the direction terminology serves only for explanation and should in no way be interpreted as limiting.

It goes without saying that further exemplary embodiments exist. It likewise goes without saying that structural or logical changes can be made to the exemplary embodiments, without in so doing departing from what is defined by the patent claims. The description of the exemplary embodiments is non-limiting in this respect. In particular, features of exemplary embodiments described below can be combined with features of others of the exemplary embodiments described, provided that nothing to the contrary is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, unless something to the contrary is clearly evident from the context.

The term or expression "electrically connected" describes a low-impedance connection between the electrically connected elements, for example a direct contact between the relevant elements or a connection via a metal and/or a highly doped semiconductor. The expression "electrically coupled" includes the fact that one or more intervening elements suitable for transmitting signals or energy can be present between the "electrically coupled" elements, e.g. elements that are controllable such that they can alternately establish a low-impedance connection in a first state and a high-impedance decoupling in a second state.

Some figures represent relative dopant concentrations by the indication "−" or "+" next to the doping type. By way of example, the designation "n−" denotes a dopant concentration which is less than the dopant concentration of an "n"-doped semiconductor area, while an "n+"-doped semiconductor area has a higher dopant concentration than an "n"-doped semiconductor area. The indication of the relative dopant concentration does not mean that doped semiconductor areas with the same relative dopant concentration indication must have the same absolute dopant concentration, unless stated otherwise. Accordingly, two different "n"-doped semiconductor areas can have the same or different absolute dopant concentrations.

If a value range with the indication of one limit value or two limit values is defined for a physical variable, then the prepositions "from" and "to" and the quantifiers "less" and "more" include the respective limit value. An indication of the type "from . . . to" is accordingly understood as "from at least . . . to at most". Correspondingly, an indication of the type "less . . . " ("more . . . ") is understood as "at most . . . " ("at least . . . ").

Main constituents of a layer or structure composed of a chemical compound are formed by the elements whose atoms enter into the chemical compound. By way of example, silicon and carbon are the main constituents of a silicon carbide crystal. Besides the main constituents, a layer or structure can comprise production-dictated impurities and/or contain secondary constituents added in small amounts to the main constituents in a targeted manner, for example dopants.

In at least one embodiment, a semiconductor component can comprise a SiC semiconductor body, in which a drift structure having a drift zone of a first conductivity type can be formed. Transistor cells can be formed in the SiC semiconductor body. Each transistor cell can respectively comprise a doping region and a source region in the SiC semiconductor body. In particular, the doping region and/or the source region can be assigned one-to-one to the respective single transistor cell.

In at least one embodiment, the doping region forms a first pn junction with the drift structure and a second pn junction with the source region. The semiconductor component can thus comprise a plurality of first pn junctions and a plurality of second pn junctions, wherein each first pn junction can be formed with the drift structure and each second pn junction with the source region of the transistor cell of the doping region.

In accordance with at least one embodiment, the doping region is electrically connected to a first load electrode of the semiconductor component. By way of example, a plurality of doping regions, for example all doping regions of the semiconductor component, can be electrically connected to the first load electrode.

In accordance with at least one embodiment, a diode region is formed between the transistor cells and a side surface of the SiC semiconductor body. The diode region is electrically connected to the first load electrode and forms a third pn junction with the drift structure. An emitter efficiency of the diode region can be higher than an emitter efficiency of the doping region.

It is possible for the diode region to carry the bipolar reverse current. A bipolar degradation can thus predominantly or exclusively concern an area of the SiC semiconductor body in which transistor cells are absent. The diode region of the semiconductor component can thus form an internal body diode that can be used e.g. as a flyback diode in reverse operation, without the performance of the semiconductor component in forward operation decreasing as a result of this type of operation.

The diode region can e.g. laterally enclose the doping region. It is possible for the diode region to laterally enclose each doping region of the semiconductor component.

In accordance with at least one embodiment, the diode region can comprise two diode partial regions separated from one another on sides of the SiC semiconductor body that are situated laterally opposite one another. The two diode partial regions can be at a distance from one another along an <11-20> crystal direction.

In accordance with at least one embodiment, the diode region can be formed on a first side of the SiC semiconductor body, wherein relative to a first surface of the SiC semiconductor body, (0001) lattice planes in the SiC semiconductor body fall toward the first side of the SiC semiconductor body. By way of example, the (0001) lattice planes can form an angle of at most 4° with the first side.

A lateral width of the diode region is e.g. at least 10 μm and at most 3 mm. It is possible for the diode region to have a uniform lateral width. In other words, the lateral width of the diode region can remain constant, i.e. be uniform, along a vertical direction. Alternatively or additionally, the lateral width of the diode region can remain constant, i.e. be uniform, along a horizontal longitudinal extent that is orthogonal to the lateral width. By way of example, the diode region can have a rectangular horizontal cross-sectional area.

In accordance with one embodiment, a dopant concentration in a section of the diode region along the third pn junction can exceed a dopant concentration in a section of the doping region along the first pn junction by at least 50%.

In accordance with one embodiment, a dopant concentration in a section of the diode region along the third pn junction can be equal to a dopant concentration in a section of the doping region along the first pn junctions.

The diode region can comprise a diode contact region adjoining the first load electrode. The doping region can comprise a contact region adjoining the first load electrode. By way of example, each doping region can comprise a contact region respectively adjoining the first load electrode. A dopant concentration in the diode contact region can be higher than a dopant concentration in the contact region of the doping region.

In accordance with one embodiment, a dopant concentration in sections of the drift structure along the first pn junctions can exceed a dopant concentration in a section of the drift structure along the third pn junction by at least 10%. The drift structure can comprise a doped auxiliary region. The doped auxiliary region can have a dopant concentration at least 10% higher than that of a section of the drift zone that directly adjoins the first pn junctions.

In accordance with one embodiment, the third pn junction is formed by the drift zone and the diode region. The drift zone and the diode region can thus directly adjoin one another.

In accordance with one embodiment, the diode region has lateral gaps. In the gaps channel sections of the drift structure can form Schottky contacts with the first load electrode.

A JTE region of the conductivity type of the diode region can be formed between the diode region and a side surface of the SiC semiconductor body. A field dielectric can be formed between the JTE region and the first load electrode. A dopant concentration in the JTE region is e.g. at most 50% of the dopant concentration in the diode region. An average dopant concentration in the JTE region is e.g. at most $5 \times 10^{17}$ cm$^{-3}$. A dopant concentration in the diode region can be at least $10^{18}$ cm$_{-3}$.

A cell array area of the SiC semiconductor body can comprise the transistor cells. A diode area of the SiC semiconductor body can comprise the diode region. In the cell array area, a density of electrically inactive recombination centers can be higher than in the diode region.

In accordance with at least one embodiment, a semiconductor component comprises a SiC semiconductor body. A drift structure having a drift zone of a first conductivity type can be formed in the SiC semiconductor body. The semiconductor component can comprise a cell array area having at least one transistor cell.

In accordance with at least one embodiment, the transistor cell comprises a doping region. Furthermore, the transistor cell can comprise a source region. The doping region can form a first pn junction with the drift structure. Furthermore, the doping region can form a second pn junction with the source region. The doping region is electrically connected for example to a first load electrode of the semiconductor component.

In accordance with at least one embodiment, a diode region is formed in a diode area between the cell array area and a side surface of the SiC semiconductor body. The diode region is electrically connected to the first load electrode. The diode region can form a third pn junction with the drift structure.

In at least one embodiment of the semiconductor component, the diode region has a higher emitter efficiency than the doping region.

Figure 1B:
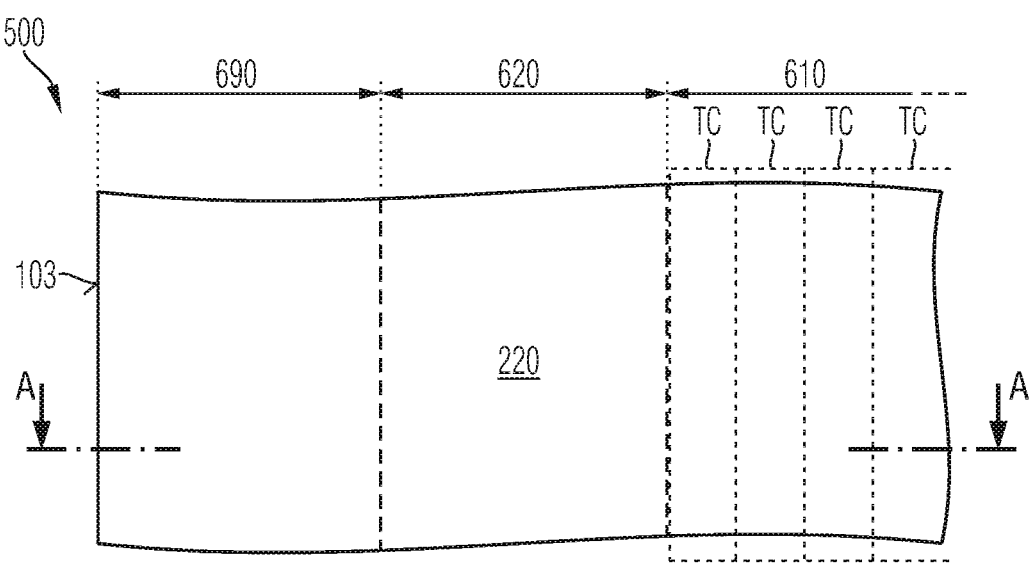

FIGS. 1A and 1B show a semiconductor component 500 comprising transistor cells TC. The semiconductor component 500 can be an IGFET (insulated gate field effect transistor), for example a MOSFET (metal oxide semiconductor FET), wherein the abbreviation MOSFET encompasses not only FETs having a metallic gate electrode but also FETs having gate electrodes composed of a semiconductor material. The semiconductor component 500 can also be an MCD (MOS-controlled diode), an IGBT (insulated gate bipolar transistor) or a semiconductor component which comprises even further electronic elements besides the transistor cells TC.

The semiconductor component 500 is based on a SiC semiconductor body 100 formed with silicon carbide. By way of example, the SiC semiconductor body 100 comprises a silicon carbide crystal or consists thereof, wherein the silicon carbide crystal can comprise doping atoms and/or impurities, e.g. hydrogen and/or oxygen atoms, besides the main constituents of silicon and carbon. The polytype of the silicon carbide crystal can be for example 2H—SiC (SiC of the 2H polytype), 6H—SiC or 1R—SiC. In accordance with one embodiment, the material of the SiC semiconductor body 100 is 4H—SiC.

A first surface 101 on the front side of the SiC semiconductor body 100 is planar or ribbed. A normal 104 to a planar first surface 101 or to a central plane of a ribbed first surface 101 defines a vertical direction. Directions parallel to a planar first surface 101 or to the central plane of a ribbed first surface 101 are horizontal and lateral directions.

On the rear side, the SiC semiconductor body 100 has a second surface 102 parallel to the first surface 101. The total thickness of the SiC semiconductor body 100 between the first and second surfaces 101, 102 can be in the range of from hundreds of nanometers to hundreds of micrometers. A side surface 103 forms the lateral outer surface of the SiC semiconductor body 100 and connects the first surface 101 to the second surface 102. The side surface 103 can be oriented orthogonally to the first surface 101.

A drift structure 130 is formed in the SiC semiconductor body 100, which drift structure can comprise at least one highly doped contact layer 139 along the second surface 102 and a weakly doped drift zone 131 of a first conductivity type between the first surface 101 and the highly doped contact layer 139. An electric field that is effective in the SiC semiconductor body 100 in the off-state case is predominantly dissipated in the drift zone 131. Doping and vertical extent of the drift zone 131 are designed in accordance with the nominal blocking capability of the semiconductor component 500. The average doping in the drift zone 131 is dependent on the nominal blocking capability and can be in a range of from $5 \times 10^{15}$ cm$^{-3}$ to $5 \times 10^{16}$ cm$^{-3}$ for nominal reverse voltages of between 600 V and 3.3 kV. By way of example, for a SiC semiconductor component having a nominal breakdown voltage of 60V, the doping can be in a range of from $1 \times 10^{16}$ cm$^{-3}$ to $3 \times 10^{16}$ cm$^{-3}$. The vertical extent of the drift zone 131 can be in a range of from 3 μm to 10 μm for a semiconductor component 500 having a nominal breakdown voltage of 600 V and an average doping of approximately $2 \times 10^{16}$ cm$^{-3}$.

Besides the drift zone 131 and the contact layer 139, the drift structure 130 can also comprise other doped semiconductor areas of the conductivity type of the drift zone 131 or of the opposite conductivity type.

The transistor cells TC are formed on the front side of the SiC semiconductor body 100 in a central cell array area 610 and each comprise a doping region 120 of a second conductivity type, complementary to the first conductivity type.

The doping region 120 of a transistor cell TC forms a first pn junction pn1 with the drift structure 130 and a second pn junction pn2 with a source region 110 of the transistor cell TC. The doping region 120 can be substantially homogeneously doped. According to another embodiment, the doping region 120 can comprise a more highly doped contact region and one or a plurality of more weakly and differently doped main regions. One such main region can be a body region of the transistor cell TC, for example, in which an inversion channel connecting the source region 110 to the drift structure 130 is formed in the on state of the transistor cell TC. A further main region can be a shielding region that shields parts of the transistor cell TC against a high electrical potential.

The source regions 110 and the doping region 120 are electrically connected to a first load terminal L1 of the semiconductor component 500. The highly doped contact layer 139 of the drift structure 130 is electrically connected to a second load terminal L2 of the semiconductor component 500.

The transistor cells TC can be lateral transistor cells having a lateral channel and having planar gate structures formed on the first surface 101, or vertical transistor cells having a vertical channel and having trench gate structures extending from the first surface 101 into the SiC semiconductor body 100. The gate structures respectively comprise gate electrodes 155, which are electrically connected to a gate terminal G of the semiconductor component 500.

The first pn junctions pn1 between the doping regions 120 and the drift structure 130 form a first section of an intrinsic body diode BD of the semiconductor component 500.

An edge termination area 690 of the SiC semiconductor body 100, said edge termination area being adjacent to the side surface 103, is free of functional transistor cells TC. Instead, in the edge termination area 690 it is possible to form an edge termination construction that ensures that the side surface 103 remains field-free during operation of the semiconductor component 500, that is to say that no or almost no potential difference between the first surface 101 and the second surface 102 is ascertainable in the area of the sidewall 103 in the off state of the semiconductor component 500. By way of example, an edge termination construction formed in the edge termination area 690, during off-state operation of the semiconductor component 500, can dissipate in a lateral direction an electric field attributed to a potential difference between the first load terminal L1 and the second load terminal L2. The dielectric strength of the edge termination construction can be at least of the same magnitude as the vertical dielectric strength in the cell array area 610.

A diode region 220 is formed in a diode area 620 between the edge termination area 690 and the cell array area 610, said diode region forming a third pn junction pn3 with the drift structure 130. The third pn junction pn3 forms a second section of the intrinsic body diode BD. The diode region 220 is electrically connected to the first load terminal L1 and thus also to the doping regions 120 with low impedance. The diode region 220 can be laterally directly adjacent to the doping region 120 or at a distance therefrom.

The diode region 220 has a higher emitter efficiency than the doping region 120. By way of example, during operation of the semiconductor component 500 within the absolute maximum ratings, i.e. within the limit values for operating and environmental conditions as specified for the semiconductor component 500 according to IEC60134, the diode region 220 can take up the entire reverse current through the semiconductor component 500, at least 90% or at least 98% of said reverse current. The cell array area 610 remains substantially free of any reverse current, that is to say that the cell array area 610 takes up a maximum of 10% of the reverse current, for example a maximum of 2%.

The higher emitter efficiency of the diode region 220 can result for example from a higher contact resistance between the doping region 120 and a first load electrode 310 than between the diode region 220 and the first load electrode 310. Alternatively or additionally, the higher emitter efficiency can result from a lower doping in sections of the doping regions 120 along the first pn junctions pn1 than in sections of the diode region 220 along the third pn junction pn3. Alternatively or additionally, the higher emitter efficiency can result from a higher doping of the drift structure 130 in a section along the first pn junctions pn1 than in a section along the third pn junction pn3. Alternatively or additionally, the higher emitter efficiency can be the consequence of a higher density of electrically inactive recombination centers in the cell array area 610 than in the diode area 620 and/or can result from a configuration of the diode region 220 as part of an MPS diode.

The current through the intrinsic body diode BD is a bipolar charge carrier flow of holes and electrons, wherein a recombination of holes and electrons can occur in the SiC semiconductor body 100. The energy released upon the recombination of holes and electrons can promote the growth of crystallographic defects and increasingly damage the SiC crystal. By way of example, dislocations between lattice planes (basal plane dislocations, BPDs) can transform into stacking faults (SFs) that continue primarily along the <0001> lattice planes and thus usually transversely with respect to the current flow direction in the drift structure 130 and thus increasingly impede the current flow between the load electrodes.

This bipolar degradation attributable to charge carrier recombination locally increases the electrical resistance in the SiC semiconductor body 100. Bipolar degradation in the cell array area 610 accordingly results in a gradual, continuous rise in the on resistance RDSon of the affected transistor cells (TC).

By contrast, in the semiconductor component 500 according to FIGS. 1A and 1B, the bipolar reverse current is spatially separated from the unipolar transistor current. The bipolar reverse current of the body diode BD is passed exclusively or for by far the most part through the diode region 220 and thus outside the cell array area 610. The bipolar degradation thus concerns exclusively or at least predominantly the diode area 620, spares the cell array area 610 and thus remains without influence on the on resistance of the transistor cells TC. A possible bipolar degradation in the diode area 620, on the other hand, remains of secondary importance since a certain increase in the forward voltage of the affected section of the body diode is partly compensated for by the negative temperature coefficients thereof. Moreover, in many applications, for example in half-bridges, the reverse current of the semiconductor component 500 is passed via the body diode only momentarily because after a short latching time that prevents a short circuit through simultaneously open high-side and low-side switches of the half-bridge, the transistor cells TC are switched on and the reverse current is thus passed completely via the switched-on transistor cells TC.

Figure 2:
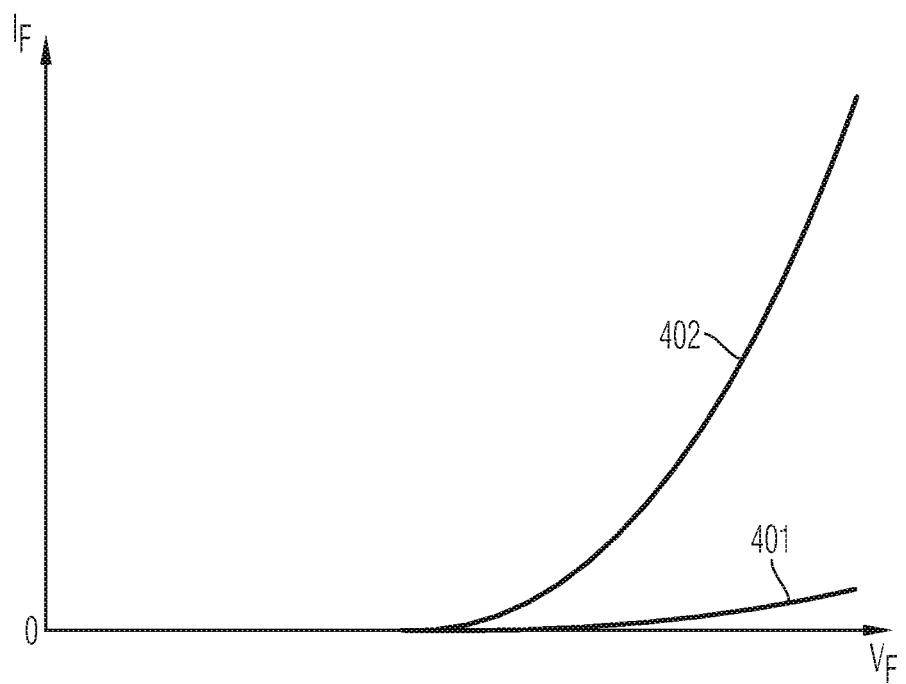
FIG. 2 is a set of characteristic curves for a first and a second section of the body diode of the SiC semiconductor component according to FIGS. 1A and 1B.

In FIG. 2, a first forward characteristic curve (referred to as: voltage-current characteristic) 401 indicates the dependence of the forward current $I_F$ on the forward voltage $V_F$ for the first section of the intrinsic body diode, said first section being formed from the first pn junctions, and a second forward characteristic curve 402 indicates the dependence of the forward current $I_F$ on the forward voltage $V_F$ for the second section of the intrinsic body diode, said second section being formed from the third pn junction.

The second forward characteristic curve 402 for the second section of the body diode lies significantly above the first forward characteristic curve 401 for the first section for every forward voltage $V_F$. For the same forward voltage $V_F$, the forward current $I_F$ through the second section of the body diode can be at least 10 times, for example at least 20 times or 98 times, the forward current $I_F$ through the first section of the body diode.

Both sections of the body diode have the same temperature response, such that the proportion of the forward current IF through the first section of the body diode is always significantly smaller than the proportion of the forward current $I_F$ through the second section of the body diode over the entire permitted temperature range.

Figure 3A:
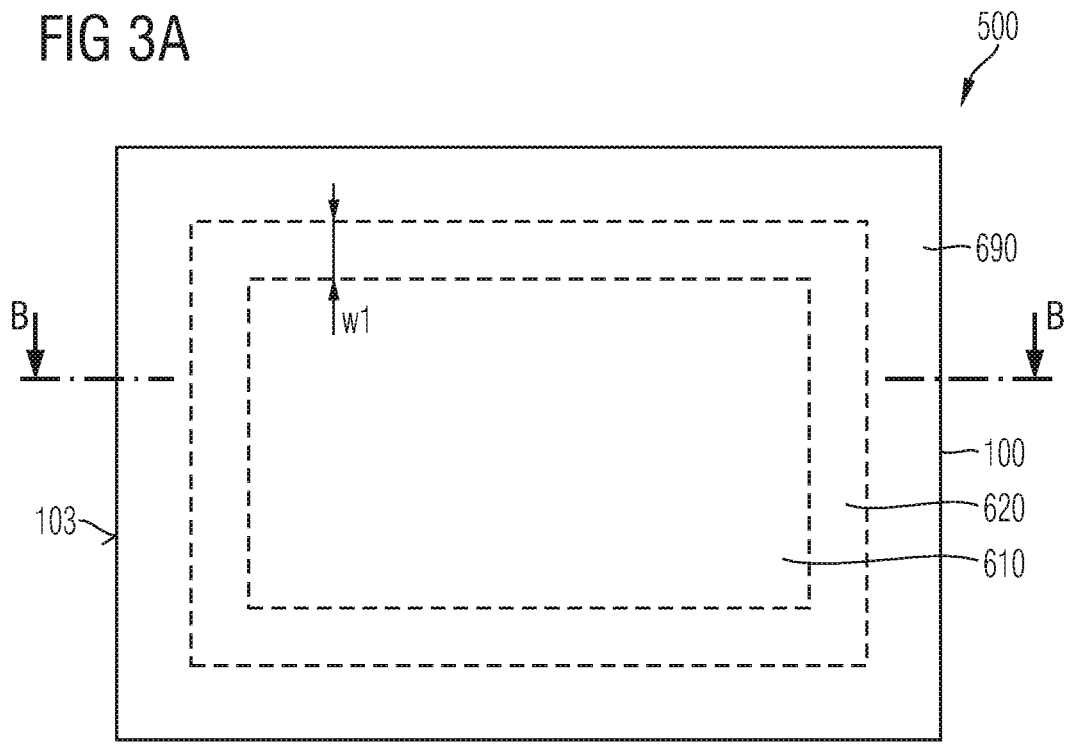
FIGS. 3A and 3B schematically show a plan view and a vertical cross section of a semiconductor component in accordance with one embodiment with a diode region enclosing a cell array area on all sides.
Figure 3B:
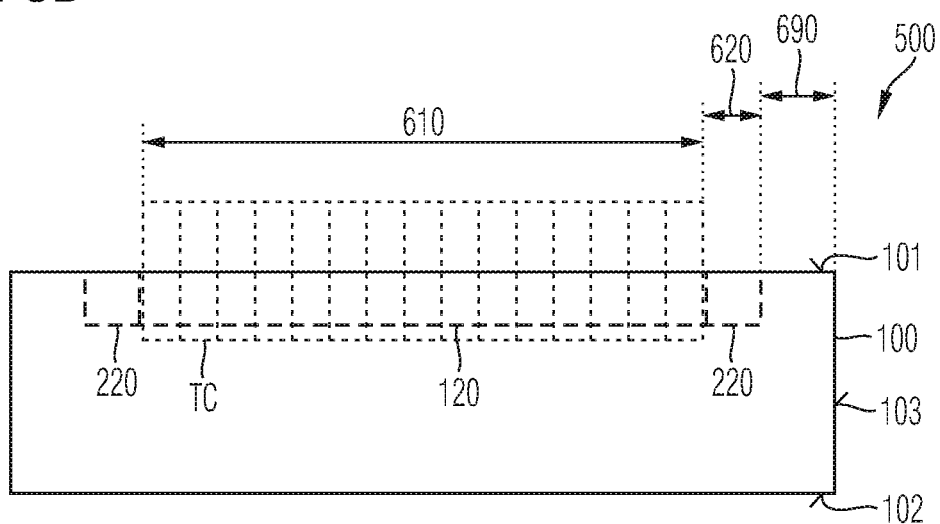

FIGS. 3A and 3B relate to an embodiment in which the diode area 620 having the diode region 220 completely encloses a central cell array area 610 having the doping regions 120 on all sides. An edge termination area separates the diode region 220 from the lateral outer surface 103 of the SiC semiconductor body 100. The edge termination area 690 is free of functional transistor cells and can instead comprise an edge termination construction.

A lateral width w1 of the diode region 220 can be identical along the entire circumference and is at least 10 μm, for example at least 100 μm and at most 3 mm, for example at most 1 mm. A dopant concentration in the diode region 220 is at least $10^{18}$ cm$^{-3}$, for example at least $5 \times 10^{18}$ cm$^{-3}$ and a maximum of $10^{20}$ cm$^{-3}$, for example a maximum of $5 \times 10^{19}$ cm$^{-3}$.

In the edge termination area 690, it is possible to form an edge termination construction which can comprise for example a JTE(junction termination extension) region of the conductivity type of the doping regions 120, wherein an average dopant concentration in such a JTE region is a maximum of $5 \times 10^{17}$ cm$^{-3}$. The JTE region can be laterally adjacent to the diode region 220 and is at least partly separated by a field dielectric from a first load electrode, which is directly connected to the diode region 220, on the front side of the SiC semiconductor body 100. The JTE region can be a single contiguous region or comprise a plurality of partial regions separated from one another. A maximum vertical extent of the JTE region can be less than a maximum vertical extent of the diode region 220. An emitter efficiency of the JTE region is less than that of the diode region 220, e.g. less than that of the doping region 120.

Figure 4A:
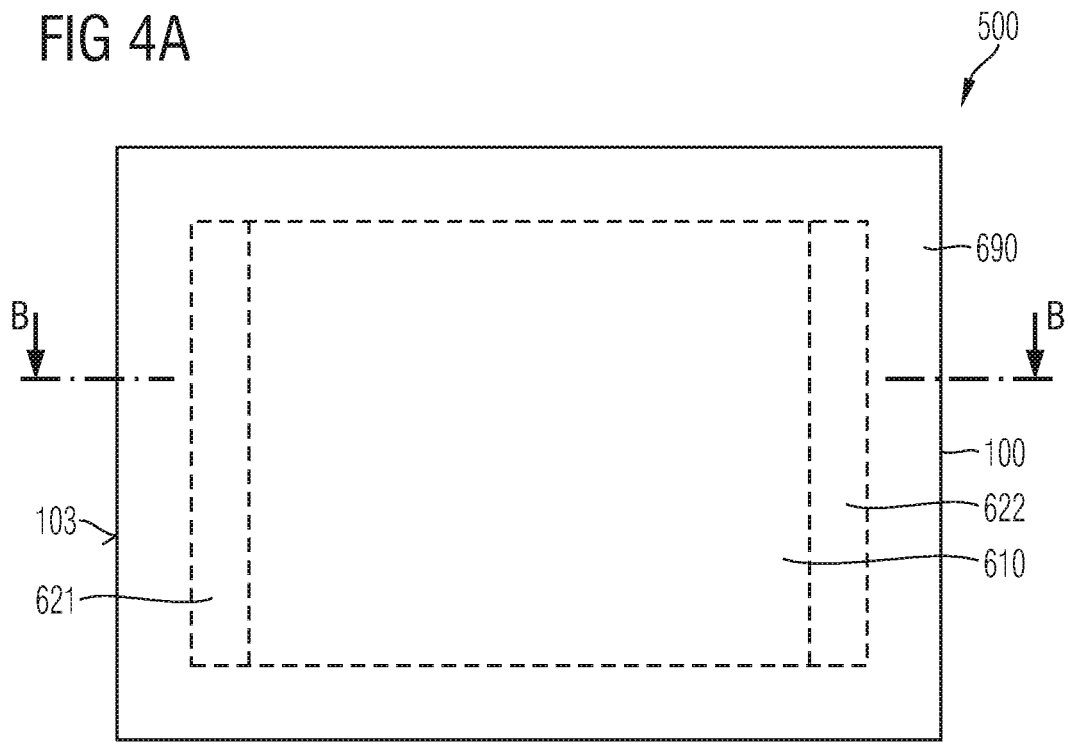
FIGS. 4A and 4B schematically show a plan view and a vertical cross section of a semiconductor component in accordance with one embodiment with two diode partial regions situated opposite one another.
Figure 4B:
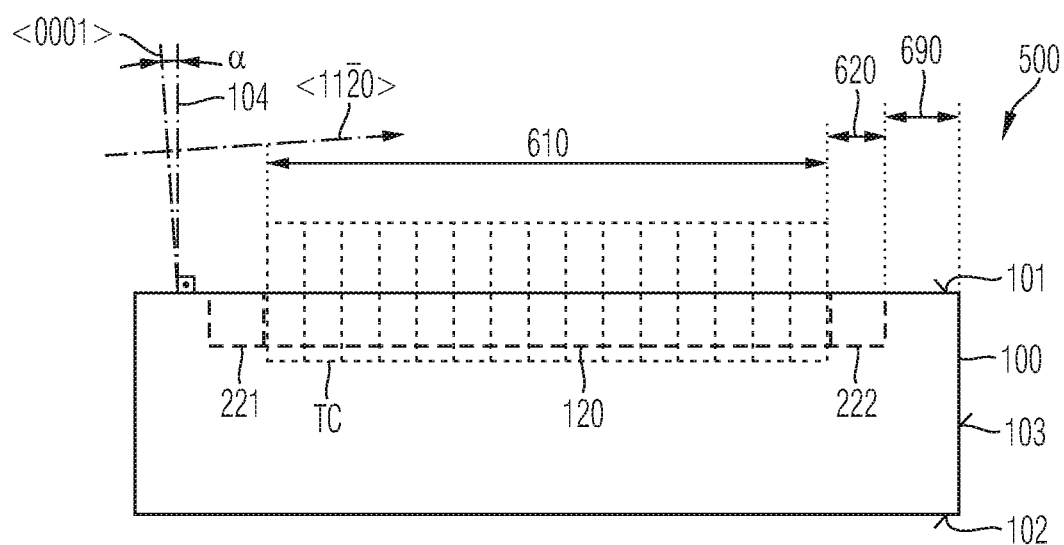

The semiconductor component 500 in accordance with FIGS. 4A and 4B comprises two diode partial areas 621, 622 separated from one another on mutually opposite sides of the intervening cell array area 610. A first diode partial region 221 is formed in the first diode partial area 621 and a second diode partial region 222 is formed in the second diode partial area 622.

The selection of the sides at which the two diode partial areas 621, 622 situated opposite one another are formed can be dependent on the orientation of the SiC crystal in the SiC semiconductor body 100.

In accordance with the embodiment illustrated, the <0001> crystal direction can extend parallel to a normal 104 to the first surface 101 or deviate from the normal 104 by an angular deviation (off-axis angle) α, wherein the angular deviation α can be at least 0° and at most 12°, for example approximately 4°, such that the (0001) lattice plane is parallel or weakly inclined with respect to the first surface 101. Furthermore, in accordance with the embodiment illustrated, the <11-20> crystal direction is inclined by the angular deviation α with respect to the horizontal plane. The <1-100> crystal direction is orthogonal to the cross-sectional plane.

The two diode partial regions 221, 222 are separated from one another along the <11-20> crystal direction. The longitudinal axes of the two diode partial regions 221, 222 extend parallel to the <1-100> crystal direction. Insofar as the bipolar degradation in the diode partial areas 621, 622 also comprises growth of crystal defects perpendicular to the <11-2> crystal direction and parallel to the (0001) lattice planes, the effect of the bipolar degradation in this respect remains limited to the diode partial areas 621, 622 and the sections of the edge termination area 690 which are adjacent to the diode partial areas 621, 622 in the longitudinal direction.

Figure 5A:
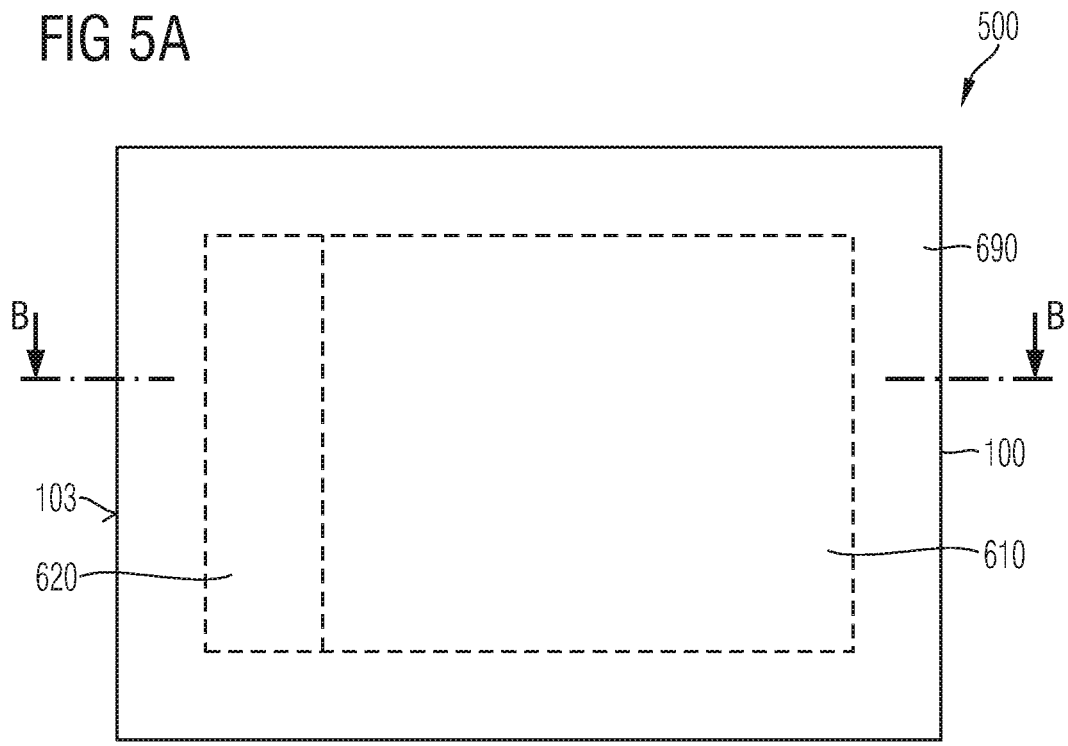
FIGS. 5A and 5B schematically show a plan view and a vertical cross section of a semiconductor component in accordance with one embodiment with a diode region formed only on one side of a cell array area.
Figure 5B:
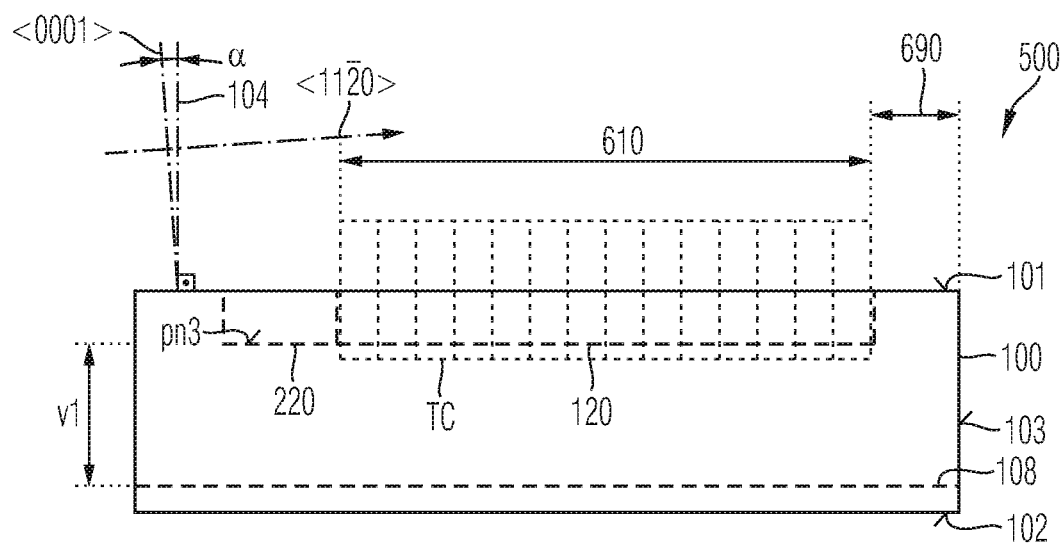

FIGS. 5A to 5B relate to an exemplary embodiment with a diode area 220 formed only on exactly one first side of the cell array area 610.

In this case, the diode region 220 is formed along that edge of the cell array area 610 which firstly extends parallel to the <1-100> crystal direction and secondly is oriented toward that side of the SiC semiconductor body 100 toward which the (0001) lattice planes fall, i.e. toward which the distance between the first surface 101 and the respective (0001) lattice plane increases.

If, given such an arrangement of the diode region 220, crystal defects propagate at or near the third pn junction pn3 along the <1-100> crystal direction, then they grow either into the edge termination area 690, with increasing distance from the first surface 101, or into the cell array area 610, with decreasing distance from the first surface 101. The maximum range of crystal defect growth into the cell array area 610 is limited since the affected lattice planes end at the first surface 101.

In the case of an imaginary diode region on the opposite side of the cell array area 610, crystal defects at or near the third pn junction pn3 which propagate along the <1-100> crystal direction grow into the cell array area 610 with increasing distance from the first surface 101 and into the edge termination area 690 with decreasing distance from the first surface 101, wherein the angle with respect to the first surface 101 is comparatively shallow. A maximum range rw of crystal defect growth into the cell array area 610 is determined only by the vertical distance v1 between the third pn junction pn3 and a lower edge 108 of a weakly doped drift zone and the angular deviation α, wherein $rw=v1/(\tan(\alpha))$ holds true. For a semiconductor component 500 having a dielectric strength of approximately 6 kV where v1=60 μm and with an angular deviation α of 4°, a maximum range rw of approximately 857 μm results for a crystal defect near the third pn junction pn3.

In the semiconductor component 500 in FIGS. 5A and 5B, crystal defects which, proceeding from the diode region 220, propagate along the <11-20> crystal direction in the (0001) lattice planes grow either in the direction of the edge termination area 690 or at most into a small partial area of the cell array area 610 that is directly adjacent to the diode region 220.

FIG. 6 shows, on the basis of the horizontal electroluminescence distribution in a SiC semiconductor body, the effect of bipolar degradation on a semiconductor component comprising transistor cells and without a separate diode region.

In the electroluminescence image, the <0001> crystal direction is tilted toward the left by an angular deviation α of 4° relative to the normal to the plane of the drawing. The <11-20> crystal direction is tilted by 4° relative to the plane of the drawing and points substantially toward the right. The <1-100> crystal direction extends parallel to the plane of the drawing upward or downward.

The dark areas represent a low current density and the light areas represent a comparatively high current density, wherein a lower current density indicates the existence of stacking faults. The electroluminescence distribution shows the anisotropic growth of initially small-scale crystal defects along predefined crystal directions.

Figure 7B:
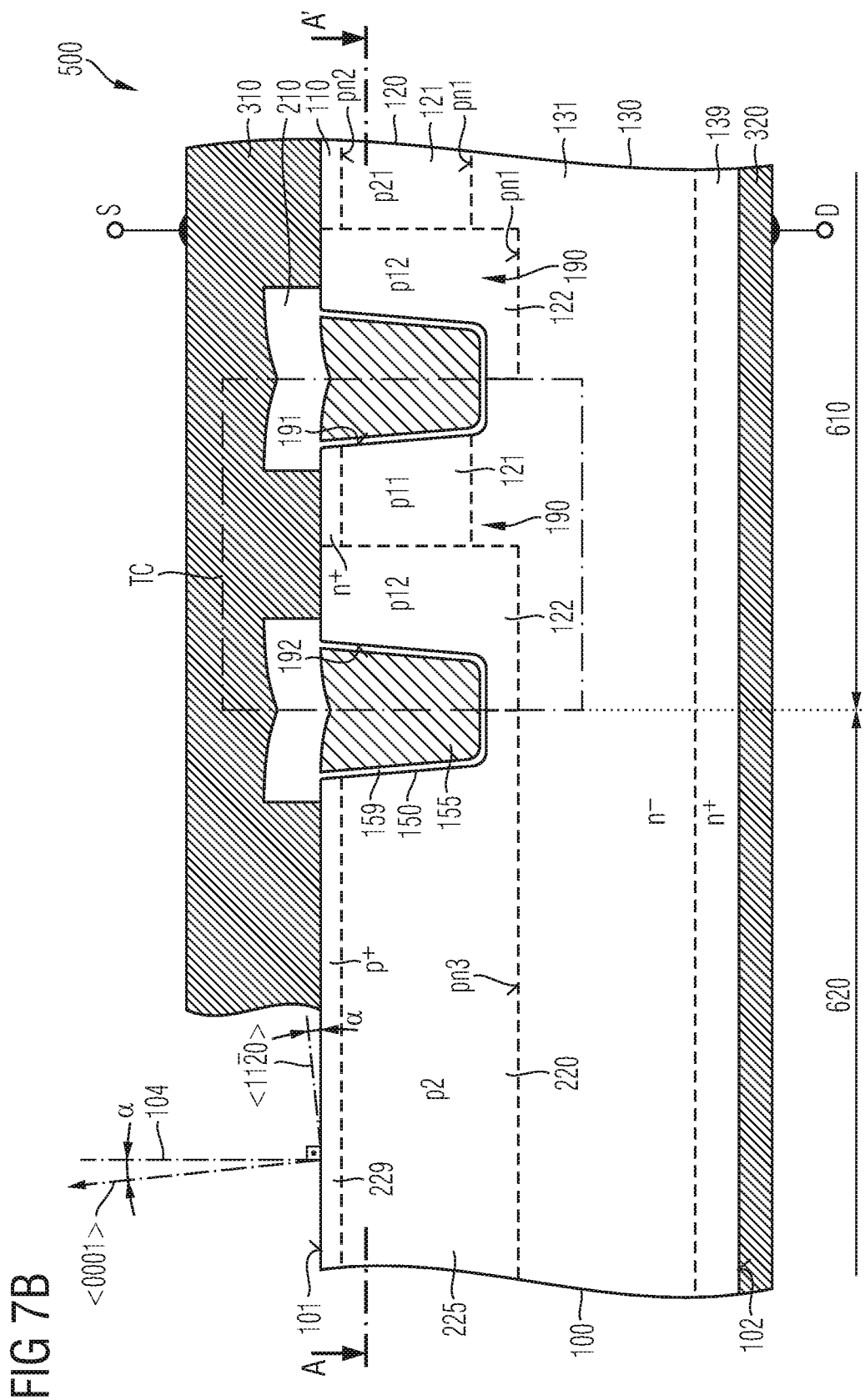

FIGS. 7A and 7B show a semiconductor component 500 comprising a SiC semiconductor body 100 having strip-like transistor cells TC and deep trench gate structures 150. For details not described below, reference is made to the above description concerning FIGS. 1A and 1B.

On a front side, the SiC semiconductor body 100 has a first surface 101, which can comprise coplanar surface sections. The first surface 101 can coincide with a principal lattice plane or extend obliquely at an angular deviation α with respect to a lattice plane, e.g. with respect to the (0001) lattice plane, wherein the angular deviation can be at most 12°, e.g. approximately 4°.

In the embodiment illustrated, the <0001> crystal direction is inclined by an angular deviation α with respect to the normal 104. The <11-20> crystal direction is inclined by the same angular deviation α with respect to the horizontal plane. The <1-100> crystal direction is orthogonal to the cross-sectional plane.

On the rear side, the SiC semiconductor body 100 has a second surface 102 parallel to the first surface 101. A total thickness of the SiC semiconductor body 100 between the first surface 101 and the second surface 102 can be in the range of from hundreds of nm to a plurality of μm.

A drift structure 130 formed in the SiC semiconductor body 100 comprises at least one highly doped contact layer 139 adjoining the second surface 102, and also a weakly doped drift zone 131 of a first conductivity type between the first surface 101 and the highly doped contact layer 139.

The highly doped contact layer 139 is of the same conductivity type as the drift zone 131 and can comprise a substrate section which is sawn from a crystal or is sliced from a crystal by some other method. Alternatively, the substrate section may have emerged partly or completely from an epitaxy method. The contact layer 139 forms an ohmic contact with a second load electrode 320, which can directly adjoin the second surface 102. Along the second surface 102, the dopant concentration of the contact layer 139 is high enough to form an ohmic contact, in particular a low-impedance contact, with the second load electrode 320.

The drift zone 131 can be formed in a layer grown by epitaxy on the contact layer 139. An average dopant concentration in the drift zone 131 is for example in a range of from $10^{15}$ cm$^{-3}$ to $5 \times 10^{16}$ cm$^{-3}$. Besides the drift zone 131 and the contact layer 139, the drift structure 130 can comprise further doped semiconductor areas, for example field stop zones, blocking zones, barrier zones and/or current spreading zones of the conductivity type of the drift zone 131 and/or insular regions of the complementary conductivity type.

The transistor cells TC on the front side of the SiC semiconductor body 100 are formed along gate structures 150 extending from the first surface 101 into the SiC semiconductor body 100, wherein mesa sections 190 of the SiC semiconductor body 100 separate adjacent gate structures 150 from one another.

A longitudinal extent of the gate structures 150 along a first horizontal direction is greater than a width of the gate structures 150 along a second horizontal direction orthogonal to the first horizontal direction and transverse to the longitudinal extent. The gate structures 150 can be long trenches extending from one side of a cell array area 610 comprising the transistor cells TC as far as an opposite side, wherein the length of the gate structures 150 can be up to a plurality of 100 μm or up to a plurality of millimeters.

In accordance with other embodiments, the gate structures 150 can be formed along parallel lines extending in each case from one side of the cell array area to the opposite side, wherein a multiplicity of gate structures 150 separated from one another are formed in each case along the same line. The gate structures 150 can also form a lattice, wherein the mesa sections 190 form the meshes of the lattice.

The gate structures 150 can be spaced apart uniformly from one another, can have the same width and can form a regular pattern, wherein a center-to-center distance between the gate structures 150 can be in a range of from 1 μm to 10 μm, e.g. from 2 μm to 5 μm. A vertical extent of the gate structures 150 can be from 300 nm to 5 μm, e.g. in a range of from 500 nm to 2 μm.

Sidewalls of the gate structures 150 can be oriented vertically with respect to the first surface 101 or can be tilted slightly relative to the vertical direction, wherein mutually opposite sidewalls can extend parallel to one another or toward one another. In accordance with one embodiment, the width of the gate structures 150 decreases with increasing distance from the first surface 101. By way of example, one sidewall deviates from the vertical by the angular deviation α, and the other sidewall by −α.

The mesa sections 190 have two opposite longitudinal mesa sidewalls 191, 192 directly adjoining two adjacent gate structures 150. At least one first mesa sidewall 191 lies in a lattice plane with high charge carrier mobility, e.g. in an (11-20) lattice plane. The second mesa sidewall 192 situated opposite the first mesa sidewall 191 can be inclined by double the angular deviation α, for example by approximately 8 degrees, with respect to the relevant lattice plane.

The gate structures 150 comprise a conductive gate electrode 155, which can comprise a highly doped polycrystalline silicon layer, an integral or a multipartite metal structure or both and is electrically connected to a gate metallization which forms a gate terminal or is electrically connected or coupled to such a gate terminal.

Along at least one side of the gate structure 150, a gate dielectric 151 separates the gate electrode 155 from the SiC semiconductor body 100. The gate dielectric 151 can comprise a semiconductor dielectric, for example a thermally grown or deposited semiconductor oxide, e.g. silicon oxide, a semiconductor nitride, for example a deposited or thermally grown silicon nitride, a semiconductor oxynitride, for example a silicon oxynitride, some other deposited dielectric material or any desired combination of the materials mentioned. The layer thickness of the gate dielectric 151 can be chosen such that a threshold voltage of the transistor cells TC is in a range of from 1V to 8V.

The gate structures 150 can exclusively comprise the gate electrode 155 and the gate dielectric 151 or can comprise further conductive and/or dielectric structures, e.g. compensation structures, field plates and/or isolation dielectrics, in addition to the gate electrode 155 and the gate dielectric 151.

In the mesa sections 190, source regions 110 are formed toward the front side of the SiC semiconductor body 100, which source regions can directly adjoin the first surface 101 and the first mesa sidewall 191 of the respective mesa section 190. In this case, each mesa section 190 can comprise a source region 110 having sections connected to one another in the SiC semiconductor body 100 or having at least two sections separated from one another in the SiC semiconductor body 100, which are connected to one another with low impedance via a contact and/or trench contact adjoining the mesa section 190.

The mesa sections 190 furthermore comprise doping regions 120, which separate the source regions 110 from the drift structure 130 and form first pn junctions pn1 with the drift structure 130 and second pn junctions pn2 with the source regions 110. The doping regions 120 form an ohmic contact with the first load electrode 310. The doping regions 120 can be substantially uniformly doped.

In the exemplary embodiment depicted, a doping region 120 comprises a more weakly doped body region 121 and a more heavily doped shielding region 122.

The body region 121 directly adjoins the first mesa sidewall 191. In the on state of the transistor cell TC, an inversion channel connecting the source region 110 to the drift structure 130 is formed in the body region 121 along the gate structure 150. A vertical extent of the body region 121 corresponds to a channel length of the transistor cells TC and can be 200 nm to 1500 nm.

The shielding regions 122 are formed between the body regions 121 and the second mesa sidewalls 192 and can directly adjoin the body regions 121. A vertical extent of the shielding regions 122 can be greater than a vertical extent of the body regions 121, for example greater than a vertical extent of the gate structures 150. A part of a shielding region 122 can be formed directly between the bottom of the gate structure 150 and the second surface 102 and shield the gate structure 150 against the potential of the second load electrode 320. A dopant concentration p12 in the shielding regions 122 along the second mesa sidewalls 192 is higher, e.g. at least five times higher, than a dopant concentration p11 in the body regions 121 along the first mesa sidewalls 191.

The first load electrode 310 can form a source terminal S or can be electrically connected or coupled to the source terminal S. The second load electrode 320 on the rear side can form a drain terminal D or can be electrically connected or coupled to the drain terminal D.

In accordance with one embodiment, the transistor cells TC are n-channel FET cells having p-doped body regions 121, n-doped source regions 110 and an n-doped drift zone 131. In accordance with another embodiment, the transistor cells TC are p-channel FET cells having n-doped body regions 121, p-doped source regions 110 and a p-doped drift zone 131.

A load current that flows through the SiC semiconductor body 100 between the first and second load electrodes 310, 320 in the on state of the semiconductor component 500 passes through the body regions 121 as a minority charge carrier flow in inversion channels induced along the gate dielectric 151. The higher dopant concentration in the shielding regions 122 in comparison with the dopant concentration in the body regions 121 suppresses the formation of inversion channels along the second mesa sidewalls 192 during operation within the absolute maximum ratings.

A diode area 620, in which a diode region 220 is formed, laterally adjoins the cell array area 610. In this case, the diode region 220 can adjoin, for example, as depicted, a shielding region 122 of the outermost transistor cell TC and/or the body region 121 of the outermost transistor cell TC. The diode region 220 can comprise a more highly doped diode contact region 229 along the first surface 101 and a more weakly doped diode main region 225.

The diode region 220 forms a third pn junction pn3 with the drift structure 130. The first pn junctions pn1 form a first section and the third pn junction pn3 a second section of an intrinsic body diode.

The diode region 220 has, for example, a higher emitter efficiency than the shielding region 122 and than the body region 121, and/or an MPS structure, and/or a sufficiently small contact resistance with respect to the first load electrode 310, such that during operation of the semiconductor component 500 within the absolute maximum ratings thereof, the diode region 220 takes up the majority of the reverse current through the SiC semiconductor body 100.

Figure 8:
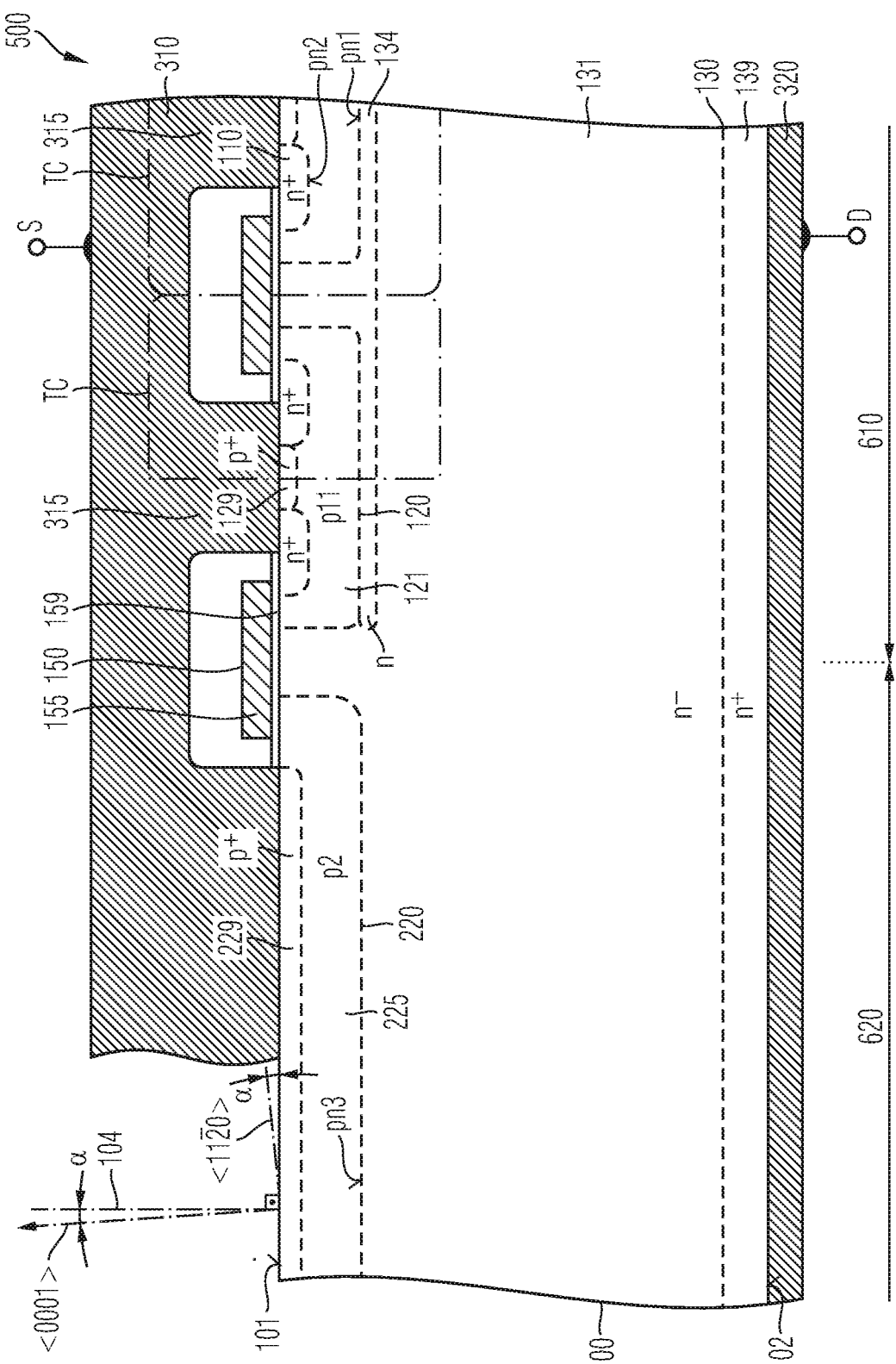
FIG. 8 is a schematic vertical cross section through a section of a semiconductor component in accordance with one embodiment with planar gate structures.

FIG. 8 shows a semiconductor component 500 comprising planar gate structures 150 on the front side of a SiC semiconductor body 100, wherein within a cell array area 610 a single gate structure 150 is assigned to two transistor cells TC formed symmetrically with respect to the gate structure 150.

The gate structures 150 comprise a conductive gate electrode 155 and a gate dielectric 151, which is formed directly on the first surface 101 and separates the gate electrode 155 from the SiC semiconductor body 100. A doping region 120 extending from a first surface 101 into the SiC semiconductor body 100 is respectively assigned to two adjacent transistor cells TC of two adjacent gate structures 150. Source regions 110 of the two transistor cells TC extend from the first surface 101 into the doping region 120. The doping region 120 comprises a contact region 129, in which the dopant concentration is higher than the dopant concentration in a main region of the doping region 120 outside the contact region 129, which can adjoin the first surface 101 between the source regions 110. The main region of the doping region 120 forms the body region 121 of the transistor cell TC.

A drift structure 130 having a drift zone 131 and a contact layer 139 separates the transistor cells TC from a second surface 102 of the SiC semiconductor body 100, wherein the drift zone 131 can extend between adjacent body regions 121 and below the gate electrodes 155 to the first surface 101.

In the on state, the transistor cells TC form lateral inversion channels in channel areas of the body regions 121 along the gate dielectric 159, said inversion channels connecting the source regions 110 to the sections of the drift structure 130 that adjoin the first surface 101, e.g. to the drift zone 131.

An interlayer dielectric 210 separates the gate electrode 155 from a first load electrode 310 on the front side of the SiC semiconductor body 100. Contacts 315 in openings of the interlayer dielectric 210 connect the first load electrode 310 to the contact regions 129 and the source regions 110.

A diode area 620, in which a diode region 220 is formed, laterally adjoins the cell array area 610. In this case, the diode region 220 can extend, for example, as depicted, to below the outermost gate structure 150 and can be at a distance from or adjoin the outermost doping region 120 of the cell array area 610. The diode region 220 can comprise a more highly doped diode contact region 229 along the first surface 101 and a more weakly doped diode main region 225.

The diode main region 225 forms a third pn junction pn3 with the drift structure 130. The first pn junctions pn1 form the first section and the third pn junction the second section of the intrinsic body diode.

The diode region 220 is configured such that during operation of the semiconductor component 500 within the absolute maximum ratings thereof, the diode region 220 takes up the majority of the reverse current through the SiC semiconductor body 100. In accordance with one embodiment, the diode region 220 has a higher emitter efficiency than the doping region 120. By way of example, an average dopant concentration p2 in the diode main region 225 is at least double the magnitude, for example at least ten times the magnitude, of a dopant concentration p11 in the body region 121. However, the average dopant concentration p2 in the diode main region 225 can also be of exactly the same magnitude as in the body region 124, for example.

Alternatively or additionally, the average dopant concentration in the diode contact region 229 can be higher, e.g. at least double the magnitude of that in the contact region 129 of the doping region 120.

Alternatively or additionally, the drift structure 130 can comprise a doped auxiliary region 134 of the conductivity type of the drift zone 131 and having a higher dopant concentration than the drift zone 131, which is formed along the first pn junctions pn1 and is absent along the third pn junction pn3. By way of example, the dopant concentration in the auxiliary region 134 is at least double the dopant concentration in the drift zone 131.

Figure 9:
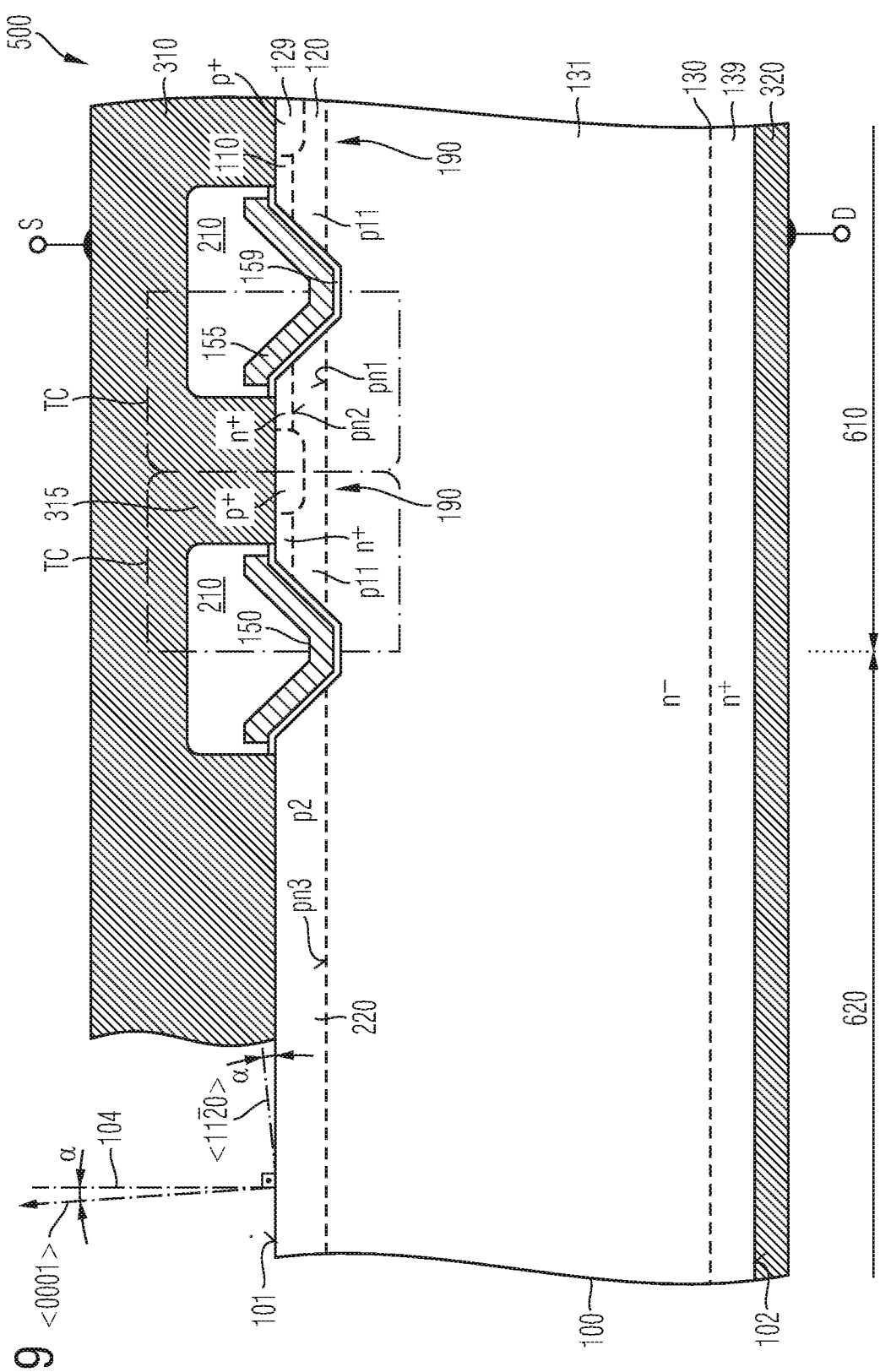
FIG. 9 is a schematic vertical cross section through a section of a semiconductor component in accordance with one embodiment with shallow trench gate structures.

In FIG. 9 the gate structures 150 are formed in shallow trenches having an approximately V-shaped vertical cross-sectional area. The gate electrode 155 can extend with an approximately uniform layer thickness along the sidewalls and the bottom of the trenches. Mesa sections 190 of the SiC semiconductor body 100 between adjacent gate structures 150 comprise source regions 110 formed along the first surface 101 and also doping regions 120 between the source regions 110 and the drift structure 130, wherein the doping regions 120 can each comprise a more weakly doped body region 121 and a more heavily doped contact region 129. A diode region 220 having a higher emitter efficiency than the doping regions 120 can be directly adjacent to the outermost gate structures 150.

Figure 10:
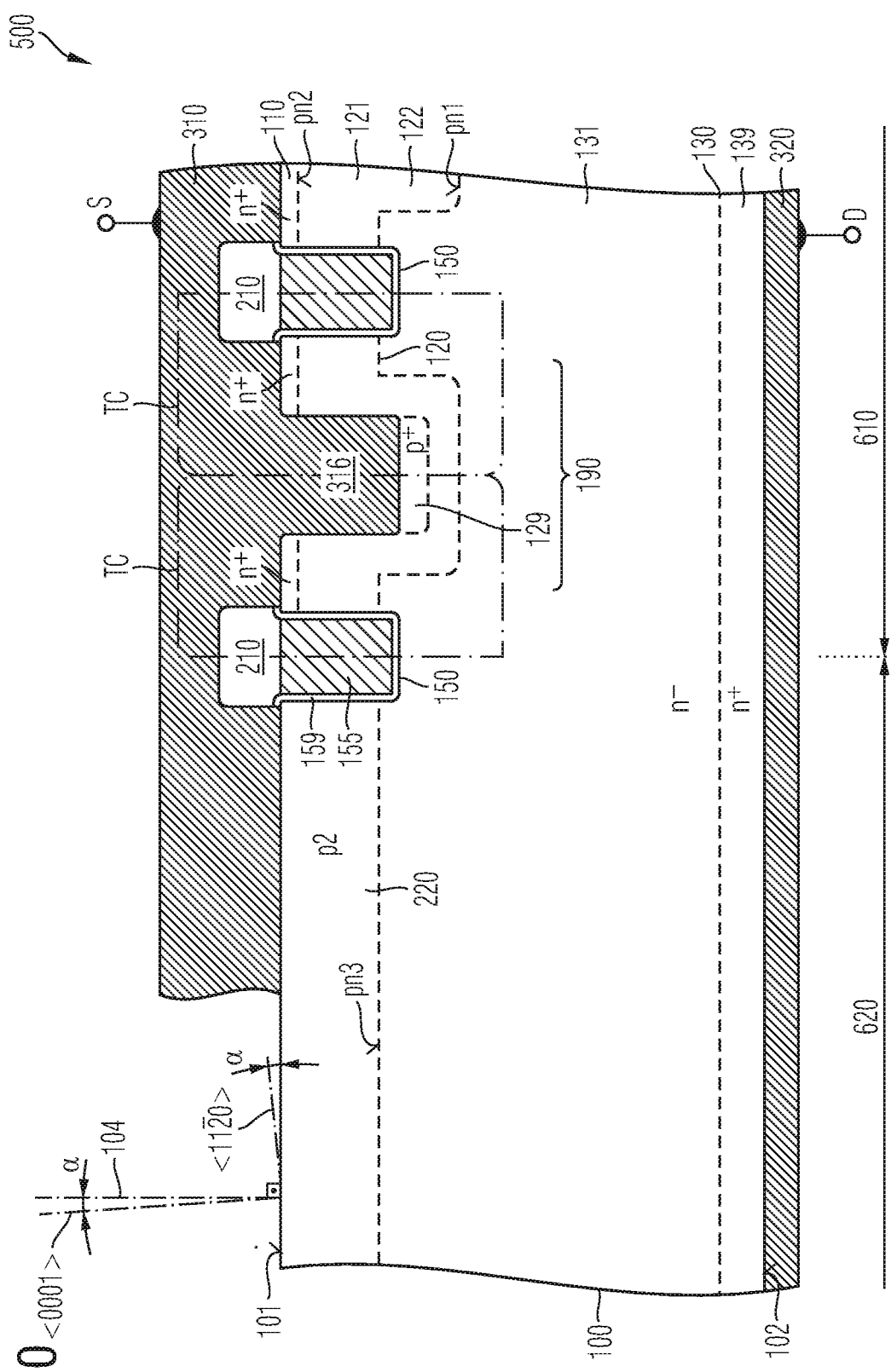
FIG. 10 is a schematic vertical cross section through a section of a semiconductor component in accordance with one further embodiment with deep trench gate structures.

The semiconductor component 500 in FIG. 10 comprises gate structures 150 extending from a first surface 101 into a SiC semiconductor body 100, wherein the sidewalls of the gate structures 150 extend vertically with respect to the first surface 101. Doping regions 120 are formed in mesa sections 190 of the SiC semiconductor body 100 between adjacent gate structures 150, said doping regions forming first pn junctions pn1 with a drift structure 130 and second pn junctions pn2 with source regions 110 formed along the first surface 101.

An interlayer dielectric 210 separates a gate electrode 155 of the gate structures 150 from a first load electrode 310. Between adjacent gate structures 150, trench contacts 316 extend from the first load electrode 310 into the mesa sections 190, laterally contact the SiC semiconductor body 100 and connect the source regions 110 to the first load electrode 310. A vertical extent of a section of the trench contact 316 in the SiC semiconductor body 100 can approximately correspond to the vertical extent of the gate structures 150.

A part of the doping region 120 can be formed in each case below the trench contacts 316 and separate the latter from the drift structure 130. A more heavily doped contact region 129 of the doping region 120 can be directly adjacent to the trench contact 316. A diode region 220 having a higher emitter efficiency than the doping regions 120 can be directly adjacent to the outermost gate structures 150.

Figure 11A:
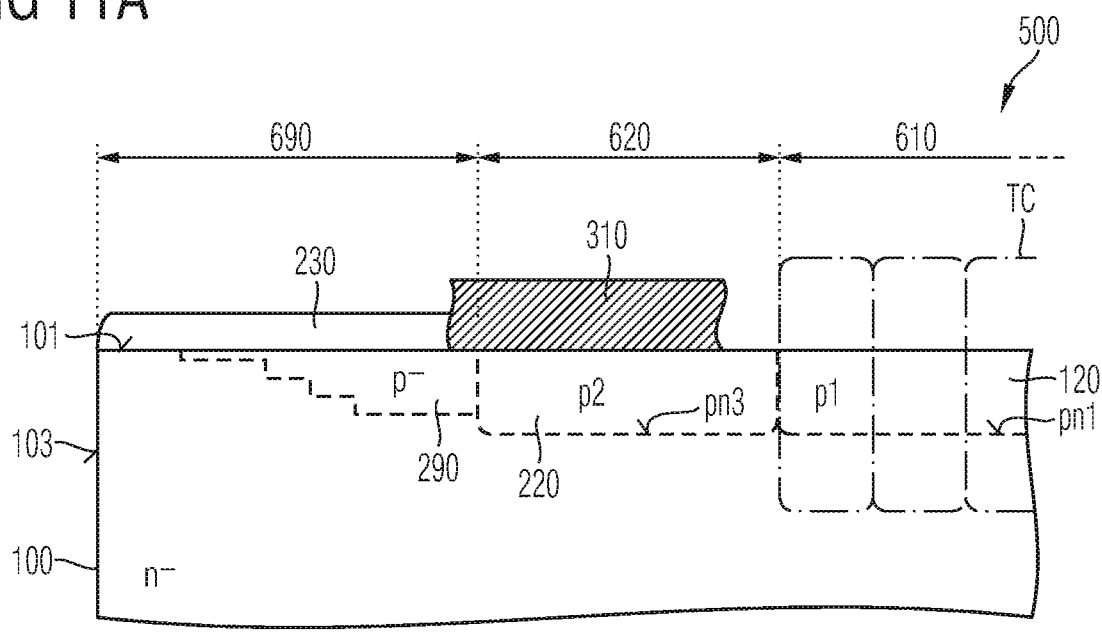
FIG. 11A is a schematic vertical cross section through a section of a SiC semiconductor component in accordance with one embodiment with an edge termination structure having a VLD(variation of lateral doping) region.
Figure 11B:
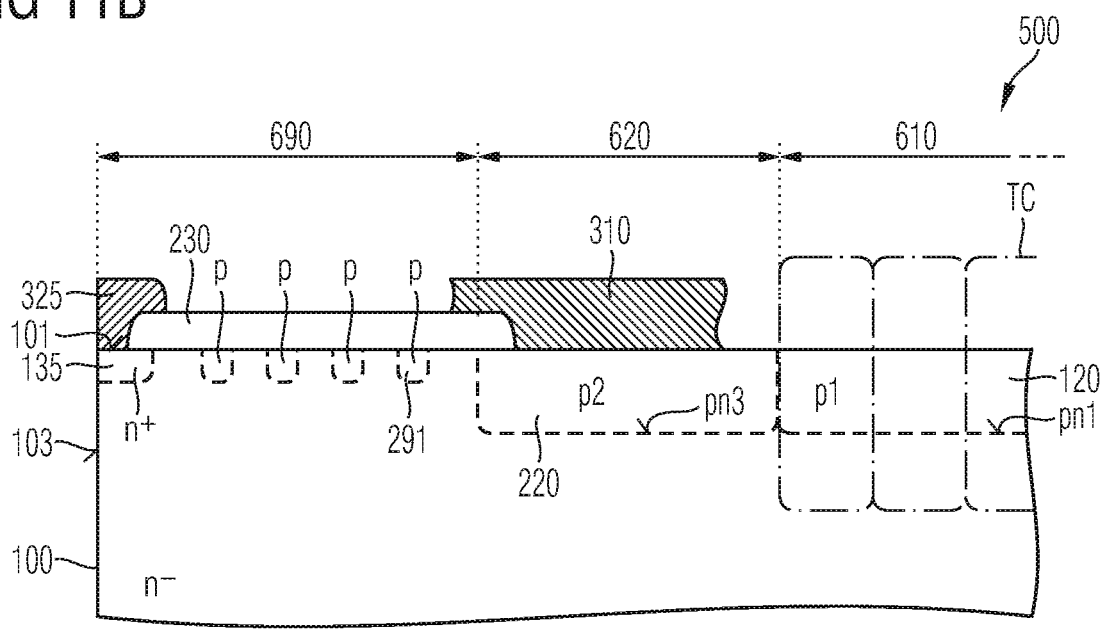
FIG. 11B is a schematic vertical cross section through a section of a SiC semiconductor component in accordance with one embodiment with an edge termination structure having potential rings.

FIGS. 11A and 11B relate to details of an edge termination construction which can be formed in addition to a diode region 220. The edge termination construction can comprise, inter alia, one or more JTE regions 290, wherein the JTE regions 290 do not directly adjoin the first load electrode 310 or adjoin the latter only in a partial area of the edge termination area 290 that is directly adjacent to the diode area 620. The JTE regions 290 have a significantly lower emitter efficiency than the diode regions 220, e.g. a lower emitter efficiency than the doping regions 120 of the transistor cells TC.

In FIG. 11A, a single JTE (junction termination extension) region 290 completely encloses an inner area of the SiC semiconductor body 100 comprising the cell array area 610 and the diode area 620. The JTE region 290 can be laterally directly adjacent to the diode region 220. The horizontal dopant dose of the JTE region 290 relative to the first surface 101 can decrease gradually or in steps with increasing distance from the cell array area 610. A field dielectric 230 can completely separate the JTE region 290 from the first load electrode 310. According to another embodiment, the first load electrode 310 can be completely absent in the edge termination area 690. An average dopant concentration in the JTE region 290 is at most 50% of the average dopant concentration p2 in the diode region 220; by way of example, the average dopant concentration in the JTE region 290 is from 1% to 10% of the average dopant concentration p2 in the diode region 220. The average dopant concentration in the JTE region 290 can be a maximum of $5 \times 10^{17}$ cm$^{-3}$.

The edge termination area 690 of the semiconductor component 500 in FIG. 11B comprises a plurality of JTE regions 290 separated laterally from one another and each completely enclosing an inner area of the SiC semiconductor body 100 comprising the cell array area 610 and the diode area 620. An average dopant concentration in the JTE regions 290 is at most 50% of the average dopant concentration p2 in the diode region 220; by way of example, the average dopant concentration in the JTE region 290 is from 1% to 10% of the average dopant concentration p2 in the diode region 220. An edge electrode 325 can be formed along the outer edge of the semiconductor component 500, said edge electrode being connected to the potential of the rear-side second load electrode via a highly doped edge contact region 135 of the conductivity type of the drift zone 131.

Figure 12:
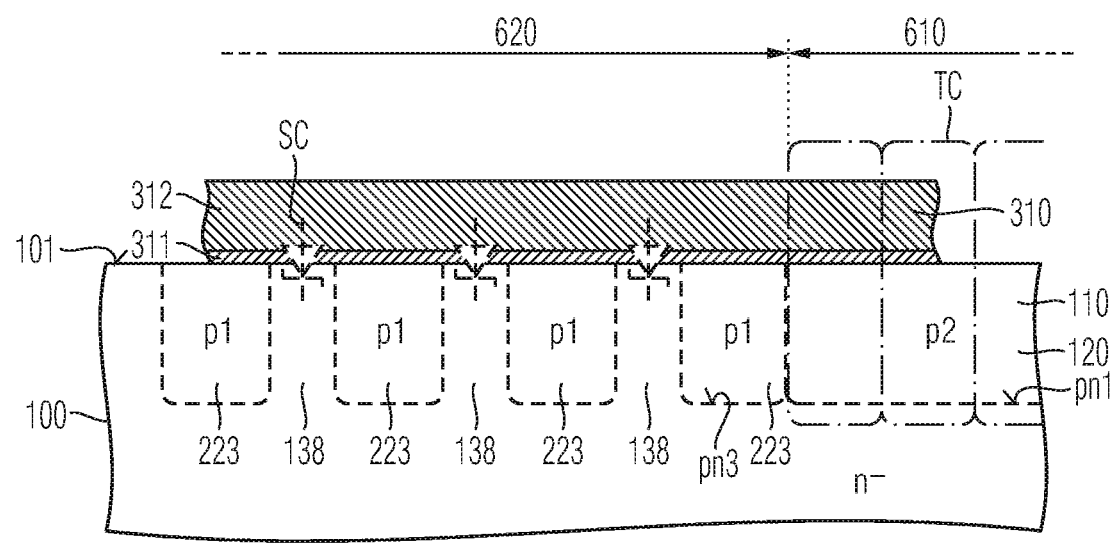
FIG. 12 is a schematic vertical cross section through a section of a SiC semiconductor component in accordance with one embodiment with a diode region having an MPS (merged pin Schottky) structure.

In FIG. 12, the diode area 620 comprises a structured diode region 220 with lateral gaps, wherein in the gaps channel sections 138 of the drift structure 130 in the diode area 620 adjoin the first surface 101. The diode region 220 can form a lattice, for example, in the meshes of which the channel sections 138 are formed. According to another embodiment, the diode region 220 comprises a plurality of strip sections separated from one another laterally.

The channel sections 138 are of the conductivity type of the drift zone 131 and form Schottky contacts with the first load electrode 310. The first load electrode 310 can comprise an interface layer 311 suitable for a Schottky contact, e.g. a layer containing titanium and/or molybdenum, and also a main layer 312 bearing on the interface layer 311, said main layer containing for example an alloy comprising aluminum and/or copper, for example AlCu and/or AlSiCu.

The structured diode region 220 of the SiC semiconductor component 500 forms the pn diode portion of an MPS (merged pin Schottky) diode and the channel sections 138 form the Schottky diode portion thereof. Up to a certain magnitude the forward current of the MPS diode flows predominantly via the Schottky contacts, such that the SiC semiconductor component 500 in this respect profits from the comparatively low forward voltage of a Schottky diode. The higher emitter efficiency of the diode region 220 by comparison with the doping regions 120 in the cell array area 610 ensures that even if the forward voltage across the Schottky diode gradually rises, the reverse current continues to flow predominantly in the diode area 620 and the growth of crystal defects in the cell array area 610 is suppressed. In addition, during reverse blocking operation of the MPS diode, space charge zones extending from the diode region 220 into the channel sections 128 can pinch off the channel sections 128 and thus keep the leakage current through the Schottky diode small.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
   a SiC semiconductor body, in which a drift structure having a drift zone of a first conductivity type is formed;
   transistor cells each comprising a doping region and a source region in the SiC semiconductor body, the doping region forming a first pn junction with the drift structure and a second pn junction with the source region, the doping region being electrically connected to a first load electrode; and
   a diode region formed between the transistor cells and a side surface of the SiC semiconductor body, the diode region being electrically connected to the first load electrode and forming a third pn junction with the drift structure,
   wherein the diode region has a higher emitter efficiency than the doping region.

2. The semiconductor component of claim 1, wherein the diode region laterally encloses the doping region.

3. The semiconductor component of claim 1, wherein the diode region comprises two diode partial regions separated from one another, and wherein the two diode partial regions are formed on sides of the SiC semiconductor body that are situated laterally opposite one another.

4. The semiconductor component of claim 3, wherein the two diode partial regions are at a distance from one another along an<11-20>crystal direction.

5. The semiconductor component of claim 1, wherein relative to a first surface of the SiC semiconductor body, (0001) lattice planes fall toward a first side of the SiC semiconductor body (100) and the diode region is formed on the first side of the SiC semiconductor body.

6. The semiconductor component of claim 1, wherein a lateral width of the diode region is at least 10 μm and at most 3 mm.

7. The semiconductor component of claim 1, wherein a lateral width of the diode region is uniform along a vertical extent of the diode region.

8. The semiconductor component of claim 1, wherein a dopant concentration in a section of the diode region along the third pn junction exceeds a dopant concentration in a section of the doping region along the first pn junctions by at least 50%.

9. The semiconductor component of claim 1, wherein a dopant concentration in a section of the diode region along the third pn junction is equal to a dopant concentration in a section of the doping region along the first pn junctions.

10. The semiconductor component of claim 1, wherein the diode region comprises a diode contact region adjoining the first load electrode, wherein the doping region comprises a contact region adjoining the first load electrode, and wherein a dopant concentration in the diode contact region is higher than a dopant concentration in the contact region of the doping region.

11. The semiconductor component of claim 1, wherein a dopant concentration in a section of the drift structure along the first pn junction exceeds a dopant concentration in a section of the drift structure along the third pn junction by at least 10%.

12. The semiconductor component of claim 1, wherein the drift structure comprises a doped auxiliary region, and wherein the doped auxiliary region has a dopant concentration at least 10% higher than that of the drift zone and directly adjoins the first pn junctions.

13. The semiconductor component of claim 1, wherein the third pn junction is formed by the drift zone and the diode region.

14. The semiconductor component of claim 1, wherein the diode region laterally comprises gaps, and wherein in the gaps, channel sections of the drift structure form Schottky contacts with the first load electrode.

15. The semiconductor component of claim 1, further comprising:
   a JTE region of a conductivity type of the diode region between the diode region and the side surface of the SiC semiconductor body.

16. The semiconductor component of claim 15, further comprising:
   a field dielectric between the JTE region and the first load electrode.

17. The semiconductor component of claim 15, wherein a dopant concentration in the JTE region is at most 50% of the dopant concentration in the diode region.

18. The semiconductor component of claim 15, wherein an average dopant concentration in the JTE region is at most $5 \times 10^{17}$ cm$^{-3}$.

19. The semiconductor component of claim 1, wherein a dopant concentration in the diode region is at least $10^{18}$ cm$^{-3}$.

20. The semiconductor component of claim 1, wherein the transistor cells are formed in a cell array area of the SiC semiconductor body, wherein the diode region is formed in a diode area of the SiC semiconductor body, and wherein the cell array area has a higher density of electrically inactive recombination centers than the diode area.

21. A semiconductor component comprising:
   a SiC semiconductor body, in which a drift structure having a drift zone of a first conductivity type is formed;
   a cell array area having a transistor cell, wherein the transistor cell comprises a doping region and a source region, the doping region forming a first pn junction with the drift structure and a second pn junction with the source region, the doping region being electrically connected to a first load electrode; and
   a diode area between the cell array area and a side surface of the SiC semiconductor body,
   wherein a diode region electrically connected to the first load electrode is formed in the diode area,
   wherein the diode region forms a third pn junction with the drift structure and has a higher emitter efficiency than the doping region.

* * * * *